United States Patent [19]
Goldberg et al.

[11] 3,996,602
[45] Dec. 7, 1976

[54] PASSIVATED AND ENCAPSULATED SEMICONDUCTORS AND METHOD OF MAKING SAME

[75] Inventors: Monroe B. Goldberg, Huntington Station; William B. Voorhis, Levittown, both of N.Y.

[73] Assignee: General Instrument Corporation, Clifton, N.J.

[22] Filed: Aug. 14, 1975

[21] Appl. No.: 604,722

[52] U.S. Cl. .................................. 357/72; 357/71; 357/73; 357/74
[51] Int. Cl.² .................. H01L 23/28; H01L 23/48; H01L 23/30; H01L 23/02
[58] Field of Search .................. 357/71, 72, 73, 74

[56] References Cited
UNITED STATES PATENTS
| | | | |
|---|---|---|---|
| 3,844,029 | 10/1974 | Dibugnara | 357/71 |
| 3,913,127 | 10/1975 | Suzuki et al. | 357/74 |

*Primary Examiner*—Edward J. Wojciechowicz

[57] ABSTRACT

A semiconductor assembly having a semiconductor and conductive lead members secured thereto by conductive metal contact members is passivated by a layer of fused particles of non-conductive glass and encapsulated in a layer of non-conductive plastic. The product combines the best characteristics of a glass passivated semiconductor and a plastic encapsulated semiconductor while avoiding the disadvantages of both.

11 Claims, 3 Drawing Figures

PASSIVATED AND ENCAPSULATED SEMICONDUCTORS AND METHOD OF MAKING SAME

BACKGROUND OF THE INVENTION

The present invention relates to a passivated and encapsulated semiconductor and methods of making same, and more particularly to a glass passivated and plastic encapsulated semiconductor and method of making same.

It has long been known that semiconductor devices are more reliable and longer lived if their active surfaces are coated with a passivating and protecting coating. Many different substances have been proposed for use in such a coating, among them various types of alkali-free glasses, including an improved alkali-free zinc-borosilicate glass described in Morrissey U.S. Pat. No. 3,752,701 (issued Aug. 14, 1973 and assigned to General Instrument Corporation). While such a glass passivation/encapsulation layer provides passivation to the semiconductor junction, mechanical handling strength, and hermeticity, it typically suffers from one or more of the following disadvantages: (1) lacking reproducibility in external size due to the nature of the material and the techniques available for applying the same, (2) being oval shaped and thus hard to handle in customers' circuit boards and customer equipment, (3) being light transparent, and (4) being difficult to mark.

In addition to glass, the prior art suggests as passivation/encapsulation materials various plastics or resins. In such a device a varnish or silastic type material is employed to achieve passivation about the semiconductor junction, the junction passivating material then being overmolded or encapsulated with an epoxy or silicone type liquid or powder molding material. However, the plastic passivation/encapsulation layers of the prior art typically suffer from one or more of the following disadvantages: (1) the varnish or silastic junction passivation material does not completely protect the semiconductor against moisture, (2) both the junction passivation and encapsulating plastic materials deteriorate at high temperature operation, (3) the encapsulative plastic provides poor permeability protection relative to glass, so that the plastic passivated/encapsulated devices show failures under pressure cooker type tests at 15 p.s.i, and (4) the encapsulating plastic frequently does not provide fire-retardant properties (although this feature may be incorporated into the plastic mold material).

The plastic passivated/encapsulated semiconductors antedate the glass passivated/encapsulated semiconductors and, despite their above-recited disadvantages, have been produced and used in such vast quantities that organizations of manufacturers and users have established dimensional standards therefor, thus making possible the development of automatic handling machinery for testing, marking, tape-reel packaging, lead bending and trimming, and automatic insertion of the devices into printed circuit boards. While all of the above-identified reliability problems characteristic of the plastic passivated/encapsulated devices are overcome in the glass passivated/encapsulated devices, the size and beaklike shape of the glass layer varies considerably from device to device. This variability, especially in conjunction with the miniature size of the beads in the newest devices, greatly increases the problems associated with automatic handling equipment, often to the point where cost-saving automatic techniques cannot be used and manual assembly costs must be absorbed to achieve the advantages of superior reliability. Thus, despite the reliability problems manifested by the older plastic passivated/encapsulated semiconductor, they remain most popular because of their mechanical design which is so readly adaptable to automation.

While semiconductor assemblies passivated and encapsulated in a combination of plastic and glass have been described in the prior art, such assemblies have not proven to be entirely satisfactory. Such semiconductor assemblies (as described in U.S. Pat. No. 3,149,396 and U.S. Pat. No. 3,237,272) typically possess one or more of the following disadvantages: (1) they are not applicable to axial lead semiconductors, (2) they utilize a special low melting point glass which fails to afford the aforementioned advantages of glass passivation/encapsulation, and (3) they utilize a microscopic passivation layer of grown lead silicate glass which affords passivation only at low voltage levels.

Accordingly, it is an object of the present invention to provide a passivated/encapsulated semiconductor assembly which combines the advantages of glass passivation and plastic encapsulation.

It is another object to provide such an assembly having a peripheral configuration which fits into automatic equipment designed for plastic passivated/encapsulated assemblies.

It is a further object to provide such an assembly which is completely resistant to moisture and withstands humidity and hermeticity tests with negligible failures.

A further object is to provide such an assembly which operates with high reliability at room temperature and at elevated temperatures, and exhibits superior thermal cycling resistance.

Another object is to provide a simple and economical process for manufacturing such a passivated and encapsulated semiconductor assembly.

SUMMARY OF THE INVENTION

It has now been found that the above and related objects of the present invention are obtained in a passivated and encapsulated semiconductor assembly, and by a method for making the same. The semiconductor assembly comprises a semiconductor, a plurality of electrically conductive metal contact members, and a plurality of electrically conductive lead members. It also includes first connecting means securing the semiconductor to an end of each one of the contact members and second connecting means securing the other end of each contact member to an end of one of the lead members.

A homogeneous passivating layer of fused particles of an electrically non-conductive preferably alkali-free glass encapsulates any exposed surfaces of the semiconductor, the first connecting means, and at least a length of the contact members. The glass is selected to have a thermal coefficient of expansion compatible with those of the contact members and the semiconductor. An encapsulating layer of electrically non-conductive plastic encapsulates any exposed surfaces of the passivating layer, the contact members, the second connecting means, and the heads or secured ends of the lead members. Preferably, the semi-conductor assembly is of the axial lead variety, with the tails or unsecured ends of the lead members extending outwardly from the plastic encapsulating layer.

In a preferred embodiment the passivating layer is homogeneous in composition and has a bead-like peripheral configuration, with a radial thickness in the plane of the semiconductor body of at least 0.13 mm, and preferably 0.13–0.25 mm. The encapsulating layer, on the other hand, has an essentially cylindrical configuration well suited for automatic handling by processing equipment presently available.

The contact members are preferably refractory metal; the glass is preferably an alkali-free zinc borosilicate glass; and the plastic is preferably an epoxy or silicone plastic.

In order to passivate the semiconductor assembly, there is applied, over any exposed surfaces of the semiconductor and at least a length of the contact members, a slurry of finely divided particles of an electrically non-conductive preferably alkali-free glass having a thermal coefficient of expansion compatible with those of the contact members and the semiconductor body. The glass particles are then heated to a temperature effective to fuse them and form a homogeneous passivating layer therefrom. To encapsulate the passivated semiconductor assembly, a non-conductive plastic is molded about any exposed surfaces of the passivating layer, the contact members, and the lead member heads secured thereto.

In a preferred process, the slurry has a slurry vehicle of de-ionized water or a non-ionic organic compound. After application, the slurry is pre-heated to remove the slurry vehicle. Then the remaining glass is heated at a temperature of about 680°–750° C for about 4–20 minutes to effect fusing thereof and formation of the resultant homogeneous passivating layer.

The passivated an encapsulated semiconductors of the present invention combine the reliability features of glass passivation with the peripheral or external configuration features of plastic encapsulation which enable the use therewith of automatic handling equipment.

DESCRIPTION OF THE PREFERRED EMBODIMENTS

Figure 1:
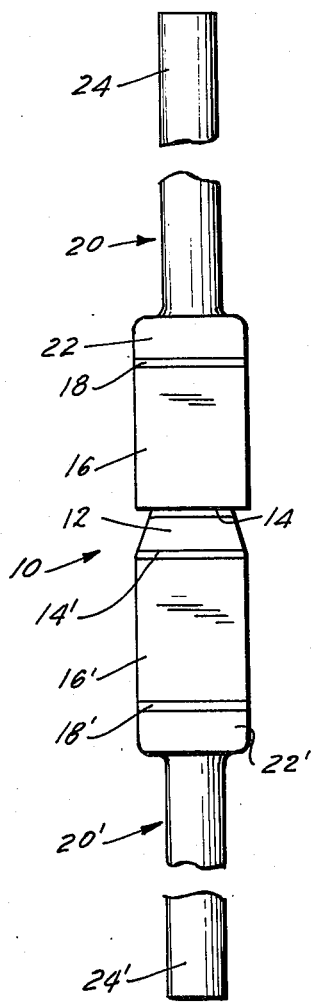
FIG. 1 is a side elevation view of a semiconductor assembly prior to passivation and encapsulation.

Referring now to the drawing and in particular to FIG. 1 thereof, therein illustrated is a semiconductor assembly of the type described in U.S. patent application Ser. No. 463,678 (filed Apr. 24, 1974), and generally designated by the numeral 10. The assembly 10 is preferably an axial lead semiconductor assembly; however, the principles of the present invention are also applicable to other types of semiconductor assemblies. The assembly 10 includes a semiconductor body 12 formed substantially of silicon, although one or more portions thereof may have minute quantities of various conventional dopants such as phosphorous, boron and the like, as will be recognized by those skilled in the semiconductor art. For clarity in illustrating the principles of the present invention, the semiconductor 12 has been illustrated as a rectifier adapted for connection to only two axial lead members, although the principles of the present invention apply equally well to semiconductors as a group, e.g., transistors, whether the N-type, P-type or combination types and whether junction, field effect or other types of semiconductors. Similarly the principles of the present invention apply regardless of whether the semiconductor device comprises a single thin wafer-lik diode (as shown) or a relatively long stack of several chips joined in series and brazed together with conventional materials (such as aluminum), with each of the individual assemblies having a plurality of leads extending therefrom.

Disposed on each end of the diffused silicon chip 12 is a thin layer 14, 14' of a conductive joining material which readily wets silicon. While aluminum is preferred for this purpose, other materials may also be used, for example, silver solder, aluminum silicon alloys. The layer 14, 14' may be applied to the silicon chip 12 by conventional techniques well-known in the semiconductor art, the preferred technique being evaporation deposition.

Extending outwardly from each layer 14, 14' is a contact member 16, 16' generally referred to as a "slug". The contact member 16, 16' is formed of an electrically conductive metal, preferably a thermally conductive refractory metal such as molybdenum, tungsten, tantalum and alloys thereof. Whether the alloys are composed of two or more of the aforementioned refractory metals, or of one or more of the refractory metals with other materials, the alloys must, of course, be selected according to their known thermal coefficients of expansion to insure that the thermal coefficients of expansion of the semiconductor body 12, the contact members 16 and any materials used to passivate the semiconductor body 12 are compatible.

Extending outwardly from each contact member 16, 16' is a brazing alloy preform 18, 18' of relatively planar configuration. The brazing alloy may comprise on a weight bases about 80–89% copper, about 5–15% silver, and about 4–6% phosphorus, and is preferably a commercially available 80/15/5 silver solder or high temperature brazing alloy of the type marketed by Englehard Industries Division of Englehard Minerals and Chemicals Corp. (Murray Hill, N.J.) under the trademark "SILVALOY 15" and by HANDY & HARMON, INC. under the trademark "SILFOS". The brazing alloy is preferably characterized by a freezing point of about 640° C and a wetting point of about 705° C, and requires neither an oxidizing nor reducing environment during the brazing process.

A nail-head axial lead member generally designated by the numeral 20, 20' has a head 22, 22' at one end thereof connected to the contact member 16, 16' by the brazing alloy 18, 18' and a tail 24, 24' available for connection to other circuit members at the other end thereof. The lead member 20, 20' is formed of a thermally and electrically conductive metal such as copper, silver or alloys thereof, the alloys of such metals by themselves or individually with other materials, being selected for their ability to braze well with the brazing alloy of the preform 18, 18'. While it is preferred that the conductive metal be formed substantially of the aforementioned copper, silver or alloys thereof, a core or sleeve is frequently used in connection with the lead member to facilitate its functioning as a heatsink for the semiconductor body 12, to reduce the cost of materials used in the lead member, and/or to provide electrical insulation for the lead member.

The means 14, 14' used to connect the semiconductor 12 with the contact members 16, 16' and the means 18, 18' used to connect the contact members 16, 16' with the lead member heads 22, 22' are not a critical feature of the present invention and other connecting means recognized by those skilled in the semiconductor art may be used in their place. Nonetheless, the aluminum connecting means 14, 14' is preferred as the aluminum and silicon 12 form a 'hard contact' eutectic having a melting point of about 575° C which joins extremely well with both the silicon body 12 and the refractory metal of contact members 16, 16'. Similarly, the copper/silver/phosphorus connecting means 18, 18' is preferred as it too forms a particularly strong high temperature joint. The resultant sub-assembly is a unitary structure having brazed joints which withstand higher temperatures than soft soldered joints, are stronger and less porous than butt welded joints, and withstand high temperature and high humidity conditions (such as 85° C and 85% relative humidity) without failure or the development of high electrical thermal resistances. The solidity and strength of the brazed joints thus formed also permit the assembly 10 to be further processed without resultant damage thereto.

Figure 2:
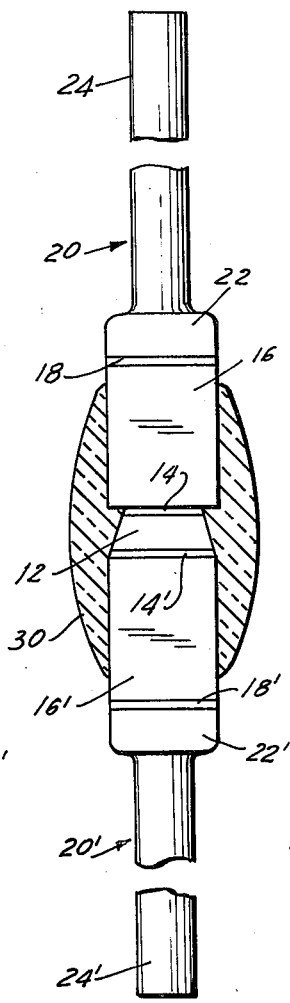
FIG. 2 is a side elevation view, partially in cross-section, of the semiconductor assembly of FIG. 1 after application thereto of a passivating layer of glass.
Figure 3:
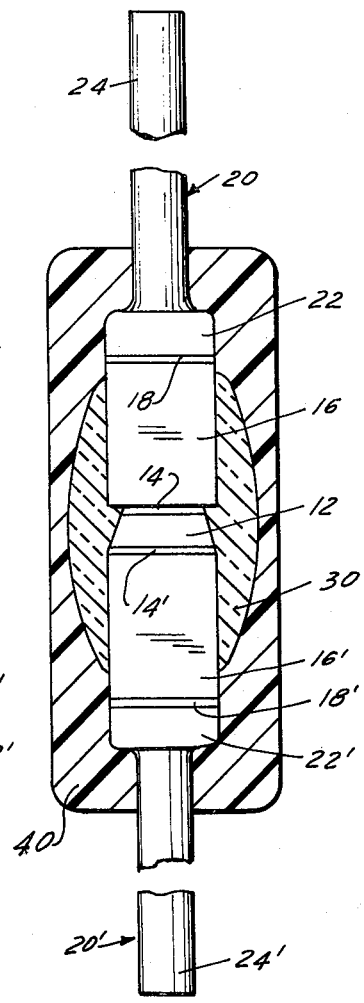
FIG. 3 is a side elevation view, partially in cross-section, of the semiconductor assembly of FIG. 2 after application thereto of an encapsulating layer of plastic.

Referring now to FIG. 2, the exposed surface of the semiconductor body 12, after etching (for example, with a solution of nitric and hydrofluoric acids) to remove contaminants, is passivated to prevent re-contamination. The passivating layer 30 extends over the exposed surfaces of the semiconductor body 12, the aluminum layers 14, 14' and at least a length of the contact members 16, 16'. It is preferred that the passivating layer 30 not contact the brazing alloy 18, 18', and the easiest method of insuring this non-contact is to terminate the passivating layer 30 short of the far ends of the contact members 16, 16'.

The passivating layer 30 is homogeneous in nature and comprises fused particles of a non-conductive high melting point glass having a thermal coefficient of expansion compatible with that of the contact members 16, 16' and the semiconductor body 12. The passivating layer 30 has a bead-like peripheral configuration with a radial thickness in the plane of the semiconductor body 12 of at least 0.13 millimeters, and preferably 0.13–0.25 millimeters, to insure passivation even at high voltage levels.

A preferred glass for use in the passivating layer 30 is the alkali-free zinc-borosilicate glass described in Morrissey U.S. Pat. No. 3,752,701 (issued Aug. 14, 1973) and containing, on a weight basis, 55–85% ZnO, 22–27% $B_2O_3$, 6–13% $SiO_2$, 2–4% PbO, and 2–4% $Al_2O_3$ and optionally 0.5–2.0% $Sb_2O_3$. Another preferred glass is an alkali-free lead-borosilicate glass containing 45–51% PbO, 36–44% $SiO_2$, 8–13% $B_2O_3$, 2–5% $Al_2O_3$ available from Innotech Corporation (Norwalk, Conn.) under the "INNOTECH 740" series of tradenames. However, other non-conductive non-contaminating glasses having a thermal coefficient of expansion compatible with that of the contact members 16, 16' and the semiconductor body 12 may be employed. A typical silicon semiconductor has a thermal coefficient of expansion of approximately $2.3-2.5 \times 10^{-6}$ cm/cm–° C; typical molybdenum contact members have a thermal coefficient expansion of approximately $4.5-5.0 \times 10^{-6}$ cm/cm–° C; and the zinc-borosilicate glass passivating layer has a thermal coefficient expansion of approximately $4.2-4.4 \times 10^{-6}$ cm/cm–° C within a temperature range of about 0°–300° C.

The degree of compatibility between the thermal coefficient of expansion (i. e., the closeness of the match) must be such as to minimize or prevent breaking of the glass passivating layer 30 or withdrawal of the contact members 16, 16' or semiconductor body 12 from the passivating layer 30 within the contemplated range of temperatures to which the assembly will be exposed. Generally thermal coefficients of expansion of the same order of magnitude will be satisfactory. (It is to be noted that in general the thermal coefficient of expansion characteristics of the joining layer 14, 14' may be ignored as a practical matter due to the extreme thinness of the layer.) The material of plastic encapsulating layer 40 is preferably an epoxy or silicone type plastic. It may be made opaque, easily markable and flame resistant, or not, as desired for particular applications. It is to be noted that in general the thermal coefficient of expansion characteristics of the plastic layer 40 may be ignored as a practical matter due to the relatively low hardness or "give" of the plastic. The plastic encapsulating layer 40 preferably has an essentially cylindrical configuration which adapts it for handling by the automatic machinery presently existing for the handling of plastic passivated and encapsulated semiconductors, so that both the reliability advantages of glass passivation resulting from layer 30 and the economic advantages of plastic encapsulation resulting from layer 40 are obtained.

Given the semiconductor assembly 10 (as illustrated in FIG. 1), the passivated and encapsulated semiconductor assembly is formed by applying a slurry of finely divided particles of glass so as to cover the exposed surfaces of the semiconductor body 12, the aluminum layer 14 and at least a length of each of the contact members 16, 16'. This is conveniently accomplished by controlled dripping of the slurry onto the semiconductor body of an axially rotating assembly 10, the rotation and the surface tension of the slurry causing a bead-like configuration to be assumed. The slurry vehicle is typically deionized water or a non-ionic organic solvent, and may be evaporated after application by heating (for example, in a hot air drier at a temperature of about 100°–400° C for about 5–30 minutes), thus leaving the glass particles alone on the desired surfaces of the semiconductor assembly 10. The glass particles are then heated to a temperature sufficient to fuse the glass particles and form therefrom a homogeneous passivating layer of bead-like peripheral configuration. Generally, heating at a temperature of about 680°–750° C for about 4 to 20 minutes is sufficient to accomplish the fusing of the glass particles into the homogeneous passivating layer 30, although the temperature and heating duration factors will, of course, vary with the type of glass used. After the passivating layer 30 has had an opportunity to cool, a non-conductive plastic encapsulating material is molded about any exposed surfaces of the passivating layer 30, the contact members 16, 16' and the lead member heads 22, 22' by conventional techniques such as casting, injection molding, etc. The dimensions and configurations of the plastic encapsulating layer 40 thus formed may be selected for ease of handling with existing equipment and are easily reproducible from one assembly to another.

The passivated and encapsulated semiconductor assemblies of the present invention have all the reliability characteristics of a glass passivated semiconductor: (1) long life under operating conditions (both reverse bias and AC operation); (2) long life under elevated temperatures and DC blocking (high voltage) conditions; (3) an absence of hermeticity failures (as evidenced by humidity cycling and pressure bomb tests); (4) an absence of intermittent forward failures due to soldering conditions or thermal cycling, and (5) high physical strength (as evidenced by passage of lead pull or bend tests with failures limited only by the strength of the lead wire itself). Furthermore, the passivated and encapsulated semiconductor assembly has a configuration similar to that of conventional plastic axial lead assemblies and can be automatically tested, branded, tape packaged, formed, and inserted on standard equipment for handling plastic axial lead semiconductor assemblies. These advantages result from the high temperature (above 600° C) brazed construction of the joints of the semiconductor assembly, the hermetic high temperature glass seal provided by use of a heavy macroscopic glass passivation layer over the silicon chip, and the uniform and reproducible peripheral configuration of the molded plastic encapsulation which meets standardized plastic packaging requirements.

Now that the preferred embodiments of the present invention have been shown and described, various modifications and improvements thereon will become readily apparent to those skilled in the art. Accordingly, the spirit and scope of the present invention is to be limited only by the appended claims, and not by the foregoing disclosure.

We claim:

1. An encapsulated and passivated semiconductor comprising
    A. a single glass passivated semiconductor assembly unit comprising
        a. a semiconductor assembly including
            i. a unitary semiconductor,
            ii. a plurality of conductive lead members,
            iii. a plurality of conductive metal contact members,
            iv. a plurality of first connecting means, each of said first connecting means securing said semiconductor to an end of a respective one of said contact members, and
            v. a plurality of second connecting means, each of said second connecting means securing the other end of said respective contact member to an end of a respective one of said lead members; and
        b. a homogeneous passivating layer of non-conductive glass having a thermal coefficient of expansion compatible with those of said contact members and said semiconductor, said passivating layer encapsulating any exposed surfaces of said semi-conductor, said first connecting means, and at least a length of said contact members, with portions of said lead members extending therefrom; and
    B. a layer of non-conductive plastic encapsulating any exposed surfaces of said passivating layer, said contact members, said second connecting means, and said secured ends of said lead members, but with each of said lead members exposed at spaced portions of said assembly unit respectively, the peripheral configuration of said encapsulating layer being such as to cooperate with automatic handling equipment and encapsulating only said single glass passivated semiconductor assembly unit; whereby said unit can be effectively handled by said equipment.

2. The assembly of claim 1 wherein said semiconductor assembly is an axial lead semiconductor.

3. The assembly of claim 1 wherein the other ends of said lead members extend outwardly from said plastic layer.

4. The assembly of claim 1 wherein said contact members are refractory metal contact members.

5. The assembly of claim 1 wherein said glass is alkali-free zinc borosilicate glass.

6. The assembly of claim 1 wherein said passivating layer is homogeneous in composition.

7. The assembly of claim 1 wherein said passivating layer has a bead-like peripheral configuration.

8. The assembly of claim 1 wherein said passivating layer has a radial thickness in the plane of said semiconductor of at least 0.13 mm.

9. The assembly of claim 1 wherein said passivating layer has a radial thickness in the plane of said semiconductor of 0.13–0.25 mm.

10. The assembly of claim 1 wherein said plastic is selected from the group consisting of epoxy and silicone plastic.

11. The assembly of claim 1 wherein said plastic layer has an essentially cylindrical configuration.

* * * * *